(12) United States Patent
Li

(10) Patent No.: US 6,372,154 B1
(45) Date of Patent: Apr. 16, 2002

(54) LUMINESCENT INK FOR PRINTING OF ORGANIC LUMINESCENT DEVICES

(75) Inventor: Xiao-Chang Charles Li, Sunnyvale, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/476,396

(22) Filed: Dec. 30, 1999

(51) Int. Cl.[7] .......................... H01L 51/40; C09K 11/06
(52) U.S. Cl. ........................... 252/301.16; 252/301.35; 106/31.15; 106/31.32; 106/31.64; 257/40; 257/103; 428/690; 428/917; 427/66; 427/64; 427/157
(58) Field of Search .................. 252/301.16, 301.35; 257/40, 103; 428/670, 917; 313/504; 106/31.15, 31.32, 31.64; 427/66, 64, 157

(56) References Cited

U.S. PATENT DOCUMENTS

| | | | |
|---|---|---|---|
| 4,153,593 A | * 5/1979 | Zabiak et al. | 106/31.15 |
| 4,186,020 A | * 1/1980 | Wachtel | 106/31.15 |
| 5,682,043 A | * 10/1997 | Pei et al. | 257/40 |
| 5,965,281 A | * 10/1999 | Cao | 428/690 |
| 6,013,982 A | * 1/2000 | Thompson et al. | 313/506 |
| 6,087,196 A | * 7/2000 | Sturm et al. | 438/29 |

OTHER PUBLICATIONS

Chang et al, "Mukticolor Organic Light–Emitting Diodes Processed by Hyrid Inkjet Printing", Adv. Mater. 11, No. 9, pp. 734–737, 1999.*
Baldo, M.A., et al., "Very High–Efficiency Green Organic Light–Emitting Devices Based on Electrophosphorescence," American Institute of Physics, 1999, 4–6.
Cao, Yong, et al., "Efficient, Low Operating Voltage Polymer Light–Emitting Diodes with Aluminum as the Cathode Material," Adv. Mater. 1998 10, No. 12, 917–920.
Chang, Shun–Chi Chang, "Dual–Color Polymer Light–Emitting Pixels Processed by Hybrid Inkjet Printing," Appl. Phys. Lett.., vol. 73, No. 18, Nov. 2, 1998, 253–55.
Garnier, Francis et al., "All–Polymer Field–Effect Transistor Realized by Printing Techniques," Science, vol. 265, Sep. 16, 1994, 1684–1686.
Li, Xiao–Chang, et al., "Synthesis and Optoelectronic Properties of Aromatic Oxadiazole Polymers," J. Chem., Soc., Chem. Commun. 1995, 2211–2212.
O'Brien, D.F. et al., "Improved Energy Transfer in Electrophosphorescent Devices," Applied Physics Letters, vol. 74, No. 3, Jan. 18, 1999, 442–44.
Tang, C.W., "Organic Electroluminescent Diodes," Appl. Phys. Lett., vol. 51, No. 12, Sep. 21, 913–15.

* cited by examiner

*Primary Examiner*—C. Melissa Koslow
(74) *Attorney, Agent, or Firm*—Fitzpatrick, Cella, Harper & Scinto

(57) ABSTRACT

Organic luminescent ink (L-ink) is disclosed for use in printing thin films of organic luminescent material. The L-ink is particularly useful in fabricating organic optoelectronic devices, e.g. organic luminescent devices. The L-ink contains at least one organic luminescent material mixed with a solvent and other functional additives to provide the necessary optical, electronic and morphological properties for light-emitting devices (LEDs). The additives play an important role either for enhanced thin film printing or for better performance of the optoelectronic device. The functional additives may be chemically bound to the luminescent compounds or polymers. Luminescent organic compounds, oligomers, or polymers with relatively low solution viscosity, good thin film formability, and good charge transporting properties, are preferred. The L-inks can be cross-linked under certain conditions to enhance thin film properties. The L-ink can be used in various printing methods, such as screen printing, stamp printing, and preferably ink-jet printing (including bubble-jet printing).

99 Claims, 1 Drawing Sheet

LUMINESCENT INK FOR PRINTING OF ORGANIC LUMINESCENT DEVICES

TECHNICAL FIELD

The present invention relates generally to luminescent ink compositions, and more particularly, to compositions and methods for printing thin films of organic luminescent material useful in fabricating organic luminescent devices.

BACKGROUND ART

Printing is a simple and efficient way to create characters, graphics and various patterning on a substrate. Various printing technologies have been developed, such as stamping, screen printing, and ink-jet printing. Ink-jet printing is a non-contact dot-matrix printing technology in which droplets of ink are jetted from a small aperture directly to a specified position on a media. Solidification of the liquid by evaporation of solvent produce patterned thin films with an image. With the advancement of digital technology and the ease of ink control by computer, ink-jet printing process has received great attention in areas where images and information are created and modified digitally. Text and graphics printing are the two most applicable areas for ink-jet printing. The ink-jet printing process also has wide applications in other areas, such as textile printing. A variety of inks designed for these applications are known.

There are, however, only a few examples on the use of ink-jet printing in optoelectronic device applications, particularly in rapidly developing organic optoelectronic device field, such as photovoltaic cells, thin film transistors, and organic light-emitting diodes. Traditionally, these devices have been fabricated by sublimation (for low molecular compounds), spin-coating and dip-coating (for polymers). The use of screen printing technology for the fabrication of organic thin-film transistors was shown by Bao in 1996 using a pure poly(3-hexyl-thiophene) as the active polymer layer [Z. Bao, et al, *Chem. Mater.*, 1997, 9, 1299].

With an aim to achieve lateral pattern control of organic luminescent films, ink-jet printing has been recently used to directly deposit patterned conducting polymer thin films and luminescent polymers for the fabrication of polymer LEDs [J. Bharathan, Y. Yang, *Appl. Phys. Lett.*, 1998, 72, 2660]. However, the thin film devices fabricated by these printing processes have sacrificed performance compared with their counterparts fabricated by other techniques, largely due to the ink materials used not being formulated or designed for printing applications. It will be appreciated that there is a need in the art for the preparation and formulation of luminescent inks designed for the direct printing of optoelectronic devices.

DISCLOSURE OF INVENTION

Traditionally, ink is used for writing, painting, and coloring on paper or textile. Commercial inks are designed for these purposes with various colors and properties. When using an ink-jet printer, the ink composition should possess properties that allow it to be jetted appropriately from the printer. During ink jet printing, droplets of ink are expelled from tiny nozzles onto a recording medium. The ink should form a meniscus at each nozzle where it is expelled in the form of droplet. After a droplet is expelled, additional ink surges into the nozzle to reform the meniscus. The ink's color, viscosity, and surface tension are important to successful printing. Many commercial inks are suitable for general printing applications, but not for thin film printing used to fabricate advanced optoelectronic devices.

The present invention is directed to luminescent ink for printing of organic luminescent devices. The luminescent ink (L-ink) includes a luminescent organic compound, an inert solvent, and a functional additive in an amount sufficient to modify the viscosity of the L-ink to a viscosity in the range up to 90,000 cp, and in an amount to modulate optical and charge transporting properties. When used with stamping and screen printing applications, the L-ink can have a very high viscosity, up to 90,000 cp, preferably up to 70,000 cp, and more preferably between 500 and 10,000 cp. But when used with ink-jet printing, the L-ink viscosity is preferably in the range from about 3 to 100 cp, and more preferably from about 3 to 15 cp.

Functional additives are molecules which are included in the L-ink composition to adjust its viscosity, but which do not adversely affect the electronic properties of the luminescent organic compound and may provide useful electronic properties. The addition of low molecular weight functional additives can be used to lower the viscosity of the L-ink, particularly L-inks containing viscous luminescent polymers. In contrast, high molecular weight functional additives can effectively increase the L-ink viscosity, especially when the L-ink contains low viscosity luminescent small molecules. Functional additives can include small molecules that possess luminescent properties by themselves. Functional additives can include small molecules that possess electron-transporting properties or hole-transporting properties. Functional additives can include a surface energy controlling substance or surfactant to enhance the morphology of the printed ink, to improve the ink/substrate-contacting angle, and to assist in electron and hole transport.

When the L-ink viscosity needs to be lowered, the functional additives are preferably small molecules having a molecular weight less than 5000 g/mol, and more preferably less than 800 g/mol. Typical low-weight organic luminescent molecules that can be used include anthracene, tris(8-hydroxy quinoline) aluminum ($Alq_3$), 4,4'-N,N'-dicarbazole-biphenyl, distyrylbenzene, 3-(2-benzothiazolyl)-7-(diethylamino)-coumarin, and rubrene. The concentration of low-weight functional additives preferably ranges between 0.5 to 40 weight percent of the solid ingredients.

When the L-ink viscosity needs to be increased, the functional additives are preferably organic luminescent polymers having a molecular weight larger than 5000 g/mol. Typical high-molecular weight organic luminescent molecules that can be used include poly(vinyl carbazole), polyfluorene, such as poly(9,9'-dialkylfluorene), poly(phenylene) derivatives, such as poly(2-silyl-phenylenevinylene) and poly(2,5-dialkoxy-phenylenevinylene), poly(3-alkyl thiophene), and poly (aromatic oxadiazole). The concentration of high-weight functional additives preferably ranges between 0.5 to 40 weight percent of the solid ingredients.

Typical electron-transporting molecules include, but are not limited to, organic compounds containing aromatic oxadiazoles, triazoles, and quinolines, or their combination. Typical hole-transporting molecules include, but are not limited to, from organic compounds containing aromatic amines, carbazoles, thiphenes, copper phthalocyanine (CuPc), poly(N-vinyl-carbazole), and polythiophene derivatives.

Various surfactants can be used as functional additives. Currently preferred surfactants include those with an ionic (anionic or cationic) or neutral terminal and alkyl terminal, having the following general formula:

MYO$_3$R (anionic)

Where R is $C_nH_{2n+1}$, or $OC_nH_{2n+1}$ with n ranging from 4 to 40; and Y is S or P; and MXR$_3$R'(cationic)

Where M is Na$^+$, K$^+$, Li$^+$, Mg$^{+2}$, or H$^+$; X is Cl$^-$, Br$^-$, I$^-$, SO$_4^{-2}$; R is methyl or ethyl, R' is alkyl $C_n$ where n is 6–40; and (CH$_2$CH$_2$O)$_n$(CH$_2$CHCH$_3$O)$_m$ (neutral)

Where n and m range from 0 to 100 and n+m ranges from 6 to 200.

The functional additives can be used to modify the charge transporting ability of the L-ink to obtain a balanced mode. As used herein, a balanced mode means the barrier height from the cathode metal (work function) to the printed luminescent film (LUMO level) is substantially equal to the barrier height from anode ITO (work function) to the luminescent film (HOMO level). A balanced mode also means that the charge transporting mobility of electrons (injected from the cathode) is substantially equal to the holes (injected from anode).

Cross-linking agents can be included in the L-ink to permit cross-linking the printed L-ink. Cross-linking can give the thin film better thermal stability and facilitate fabrication of multi-layer luminescent devices. Cross-linking agents are preferably added to the L-ink in a concentration in the range from about 0.5 to 30 wt. % of the solid ingredients, and more preferably from about 1 to 10 wt. % of the solid ingredients.

The L-ink solvent preferably has a boiling point in the range from about 40° C. to about 200° C. Some currently preferred solvents include, but are not limited to, water, alcohol, dioxane, toluene, chloroform, tetrahydrofuran, dichlorobenzene, 1,2-dichloroethane, and xylene. The L-ink preferably contains from about 50% to about 99.8% solvent, by weight.

The present invention also includes a method of fabricating organic luminescent devices. Such luminescent devices will include a first electrode. The L-ink is printed onto the first electrode surface to form a thin film of luminescent material. The L-ink is preferably printed by ink-jet printing (including bubblejet printing), stamp printing, or screen printing. A second electrode is electrically coupled to the thin film of luminescent material. Additional thin films of luminescent material can be printed over the first thin film as needed to fabricate the device. Such thin films can be printed with different luminescent inks. A variety of devices can be fabricated using L-inks within the scope of the present invention, such as LED, thin film transistor, photovoltaic solar cell, electrochemical luminescent display device, electrochromic display device, and electroluminescent flat-panel display device.

DETAILED DESCRIPTION OF THE PREFERRED EMBODIMENTS

Figure 1:
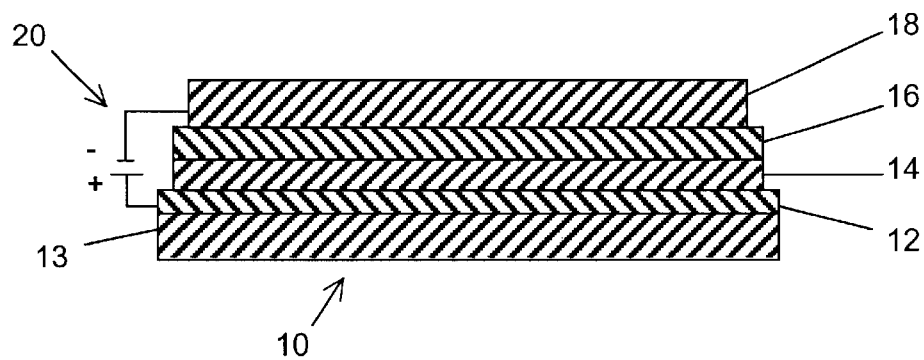
FIG. 1 is a schematic cross-sectional representation of one possible solid state electronic device containing printed luminescent thin films within the scope of the present invention.

The present invention relates to the general design and preparation of organic luminescent ink (hereafter referred to as "L-ink") used to fabricate solid thin film optoelectronic devices by ink-jet printing, screen printing, stamp printing or other similar printing technology. The favorable L-ink morphology enables thin films to be printed with L-ink that possess good optical and electronic performance. The L-ink within the scope of the present invention may have a general formula:

Luminescent organic chromophore(s)+solvent(s)+functional additive(s)

L-ink contains at least one organic luminescent component or chromophore for light emission either by photo- or electro-luminescent mechanisms. Depending on the luminescent component used in the L-ink, luminescence color may be varied throughout the whole visible region, with specific colors like red, green or blue. Depending on the molecular weight of the luminescent component there are two classes of luminescent chromophores, namely organic luminescent compounds and luminescent polymers. In addition to a necessary liquid as a solvent, L-ink contains at least one other functional additive, such as viscosity controlling substance, surface energy controlling substance, mechanical binder, cross-linking reagent, electron-transporter, hole transporter, dopant for excited energy state transfer, etc.

As used herein, the term "functional additive" refers to molecules which are included in the luminescent ink composition to adjust the viscosity and to facilitate defect-free thin film formation, but which do not adversely affect the electronic properties of the luminescent organic compound. The functional additive can include small molecules having a molecular weight less than 5000 g/mol, and preferably less than 800 g/mol, to lower the L-ink viscosity. Functional additives can include small molecules that possess luminescent properties by themselves. Examples of such molecules include tris(8-hydroxyquinoline) aluminum (Alq$_3$), nathptha-phenyl benzidene (NPD), copper phthalocyanine (CuPC), and coumarin. Functional additives can include small molecules that possess electron-transporting properties, such as 2-phenyl-5-tert-butyl-biphenyl-1,3,4-oxadiazole (PBD). Functional additives can include small molecules that possess hole-transporting properties, such as triphenyl amine and naphtha-phenyl benzidene (NPD). Functional additives can include a surface energy controlling substance or surfactant to enhance the morphology of the printed ink, to improve the inkisubstrate-contacting angle, and to assist in electron and hole transport. Examples of typical surfactants that can be used in the present invention include anionic ether sulfates, R(OCH$_2$CH$_2$)$_n$OSO$_3$Li, and anionic ether phosphates, [RO(CH$_2$CH$_2$O)$_n$]$_2$P=OOLi, n=1–50. [Y.Cao, G. Yu, A. J. Heeger, Adv. Mater., 1998, 10(12), 917].

The addition of low molecular weight functional additives can be used to lower the viscosity of the L-ink, particularly L-inks containing viscous luminescent polymers. In contrast, high molecular weight functional additives can effectively increase the L-ink viscosity, especially when the L-ink contains low viscosity luminescent small molecules.

The optoelectronic thin film devices may be a light-emitting device, a thin film transistor, a photovoltaic solar cell, an electrochemical luminescent display device, or an electrochromic display device. The optoelectronic device is preferably an electroluminescent device for active light emission applications such as backlights, pilot lights, and flat-panel displays. For all these applications, the thin film thickness is preferably between 20 nm to 4,000 nm. The thin film should be pinhole free, mechanically robust, and transparent.

The key parameter for the L-ink is luminescence. In order to be luminescent, the ink must contain at least one conjugated chromophore. The chromophore should be highly luminescent under UV irradiation and/or under a suitable electric field bias. Typical luminescent compounds which can be used in the present invention are: rubrene which emits red light; 2-{2-[2-(2,3,6,7-tetrahydro-1H,5H-pyrido[3,2,1-ij]quinolin-9-yl)-vinyl]-pyran-4-ylidene}-malononitrile (DCM-2) which emits red light; coumarine 6 which emits orange light; tris(8-hydroxyquinoline) aluminum ($Alq_3$) which emits green light; 1,1,4,4-Tetraphenyl-1,3-butadiene (TPB) which emits blue light; and di-naphthalene-1-yl-diphenyl-biphenyl-4,4'-diamine (α-NPA) which emits blue light. Other known and novel luminescent compounds can be used in the L-inks according to the present invention. Selection of specific luminescent compounds will vary depending upon the color and electronic requirements of the optoelectronic device. Scheme 1, below, illustrates some of these typical luminescent organic compounds that can be used in the present invention.

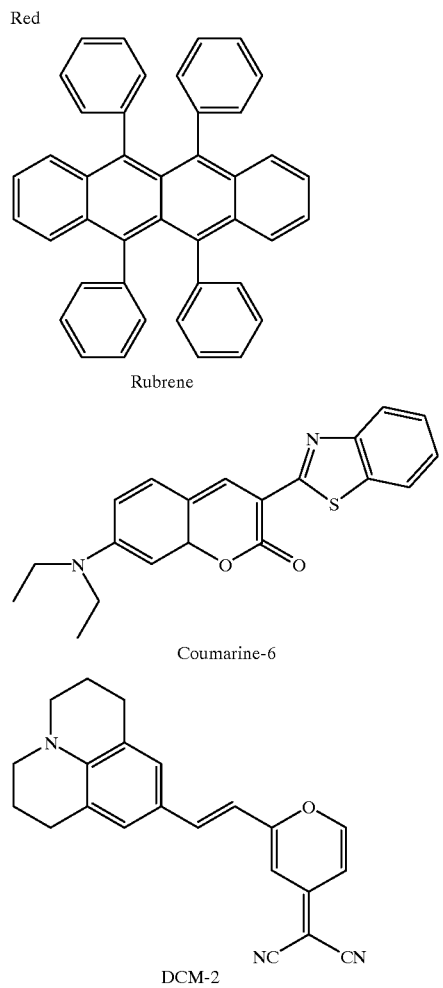

Red

Rubrene

Coumarine-6

DCM-2

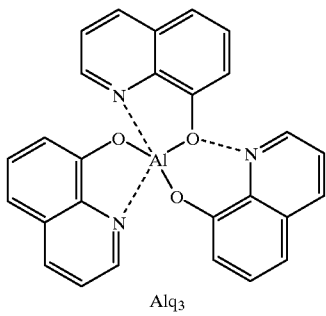

Green $Alq_3$

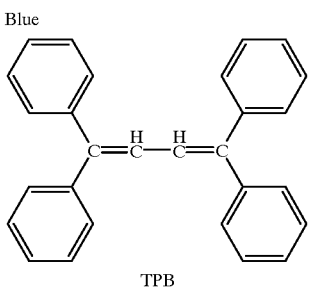

Blue

TPB

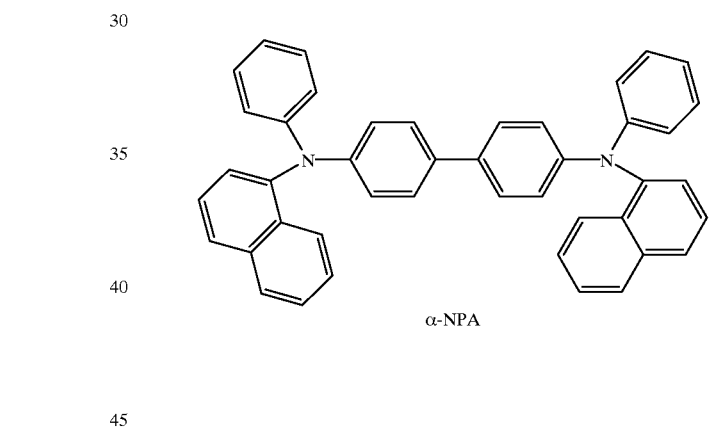

α-NPA

Scheme 1: Representative Luminescent Chromophores for L-ink

The luminescent organic chromophore can be a conjugated polymer that is highly luminescent. Such polymers can produce a range of luminescent visible colors from red, green to blue, by selecting different structures. Typical examples of luminescent polymers that can be used in the present invention include: poly[2-methoxyl-5-(2'-ethylhexyl) phenylenevinylene] (MEH-PPV), poly[2,5-dioctyloxy-1,4-phenylenevinylene], poly(2-silyl-1,4-phenylenevinylene), poly(2,5-disilyl-phenylenevinylene), poly(3-alkyl-thiophene), poly(2,5-dialkyl-1,4-phenylenevinylene), poly(9,9'-dialkyl-fluorene), poly(2,5-dialkoxy-phenylene), poly(2,5-dialkyl-phenylene), poly(N-vinyl carbazole), etc. Scheme 2 shows some of representative luminescent polymers. Alternatively, other luminescent polymers may be prepared according to specific requirements.

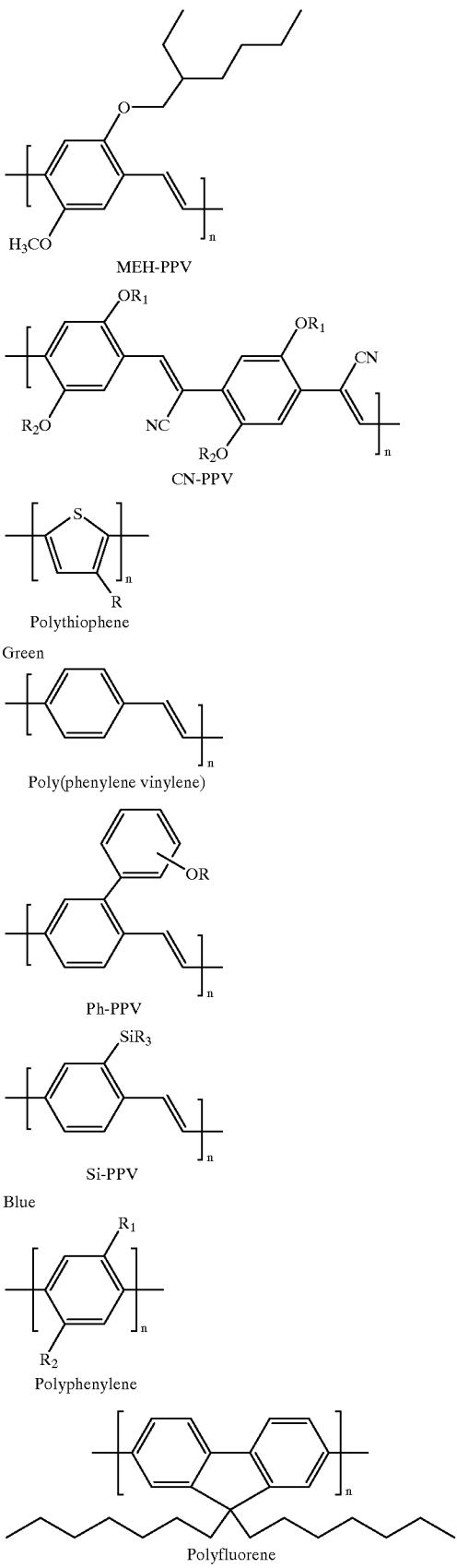

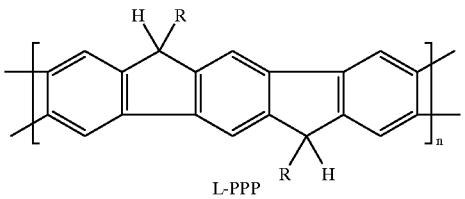

L-PPP

R, R₁ and R₂ are flexible alkyls or $C_6$–$C_{12}$

*MEH-PPV: poly[2-methoxy-5-(2′-ethyl-hexyloxy)-phenylenevinylene]

Scheme 2: Representative Structures of Luminescent Polymers with Various Color

The L-ink is a mixture of luminescent material and functional ingredients dissolved in a suitable solvent or solvent mixture. The solvent is preferably inert, that is, it does not react with the L-ink ingredients. The solvent may be an organic liquid, like chloroform, dichloroethane, toluene, xylene, dichlorobenzene, trichlorobenzene, tetrahydrofuran, dimethylformamide (DMF), dimethylsulfoxide (DMSO), N-methyl-pyrrolidone (NMP), polyethylene glycol (PEG), acetone, ethanol, methanol, propanol, dioxane, or may be an inorganic liquid, like water, ammonia aqueous solution, or triethylamine solution. The boiling temperature of the solvent or solvent mixture should be preferably between 35 to 220° C., and preferentially between 60 to 160 ° C.

Thin films with even thickness and uniform morphology are highly desired for optoelectronic device. A single defect (e.g. pinhole) in the thin film device area can potentially short circuit the optoelectronic device while an electric field is applied. Uneven thin film will lead to non-uniform light emission due to different electric field (V/cm) distribution in the device area. In order to achieve pinhole free and uniform luminescent thin film, the L-ink is preferably formulated to satisfy both mechanical and optoelectronic requirements.

Where a luminescent compound is used, a polymer binder selected to bind to the luminescent compound is preferably also used to achieve a pinhole-free thin film and to increase the mechanical strength of the printed thin film. The quantity of the binding polymer included in the L-ink is preferably between 0.2 to 30% (weight in solid state thin film). The binding polymer can include known and novel binding polymers. Several commercially available binding polymers that can be used with the luminescent compounds in the L-ink include, but are not limited to, poly(ethylene) (PE), poly(propylethylene) (PP), poly(styrene) (P1S), poly(methyl methacrylate) (PMMA), with a general molecular formula as described in Scheme 3. Alternatively, the binding polymer may also be prepared according to specific requirements. Preferably, a luminescent polymer emitting the desired color is used.

For L-inks using organic luminescent compounds or polymer luminescent materials, other functional ingredients are added to achieve better combinatory performance. For instance, electron-transporting materials with high electron affinity, such as organic compounds containing aromatic oxadiazoles, tiazoles, or quinolines, may be added to assist electron injection for the L-ink. Examples of other electron-transporting materials which can be included in the L-ink are: 2-tert-butyl-phenyl-5-biphenyl-1,3,4-oxadiazole (PBD), Alq3, poly(phenyl-1,3–4-oxadiazole).

Similarly, hole-transporting materials with low highest unoccupied molecular orbital (HOMO) level, such as organic compounds containing aromatic amines, copper phthalocyanine (CuPc), poly(N-vinyl-carbazole), polythiophene derivatives, etc. may be added to assist hole injection for the ink. Scheme 4 illustrates representative charge transporting materials.

Electron transporting materials:

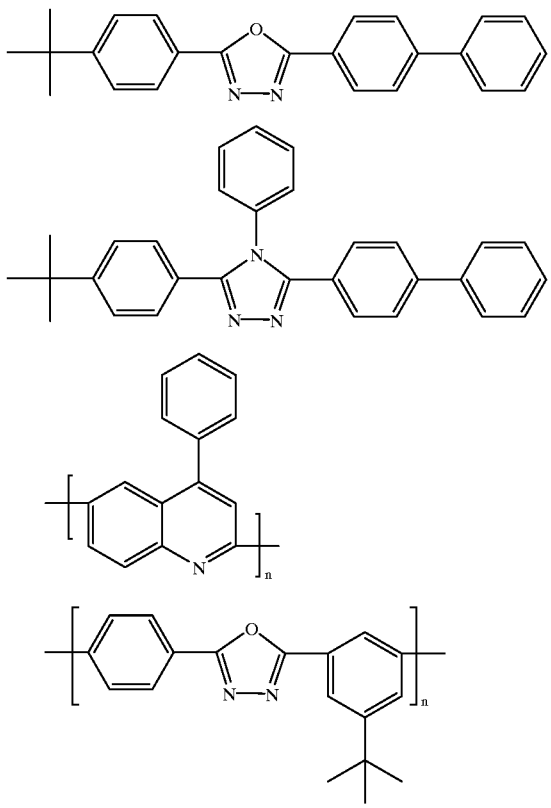

Hole transporting materials:

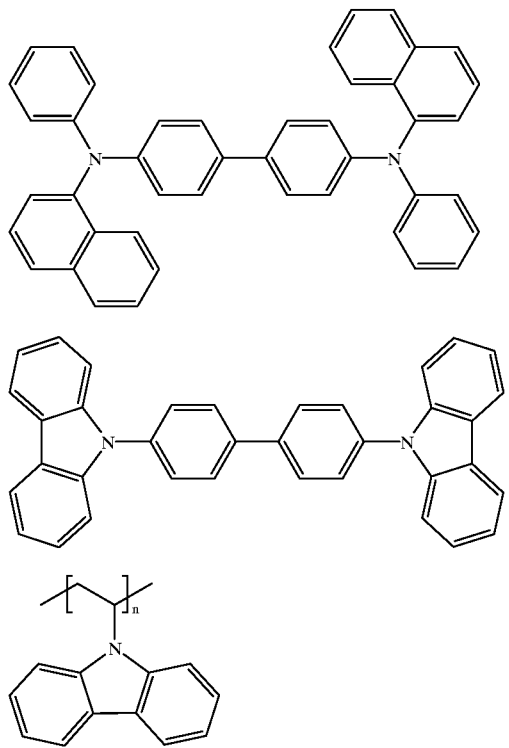

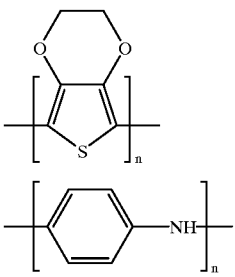

Scheme 4: Example of Charge Transporting Materials for L-inks

To obtain L-inks that can be further cross-linked under certain conditions, a cross-linkable additive may be added. The cross-linking reactive functional group is selected from acrylate, cynamoyl, azide, epoxide, styrene, and hydrosilane. The cross-linking process can be easily accomplished by heating, or by light irradiation. Cross-linking the printed L-ink will give the thin film better thermal stability as a result of network structure formation. Since the cross-linked thin film is no longer soluble in solvents, multi-layer printing is then possible, which facilitates the fabrication of high performance multi-layer LEDs. Examples of the cross-linking reagents are illustrated in Scheme 5.

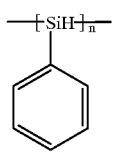

Poly(hydrosilane)

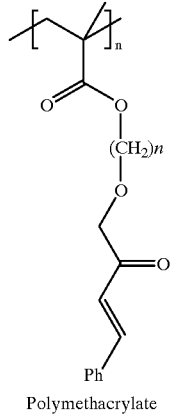

Polymethacrylate

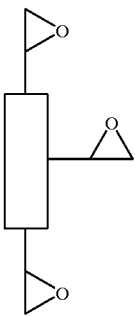

Epoxide

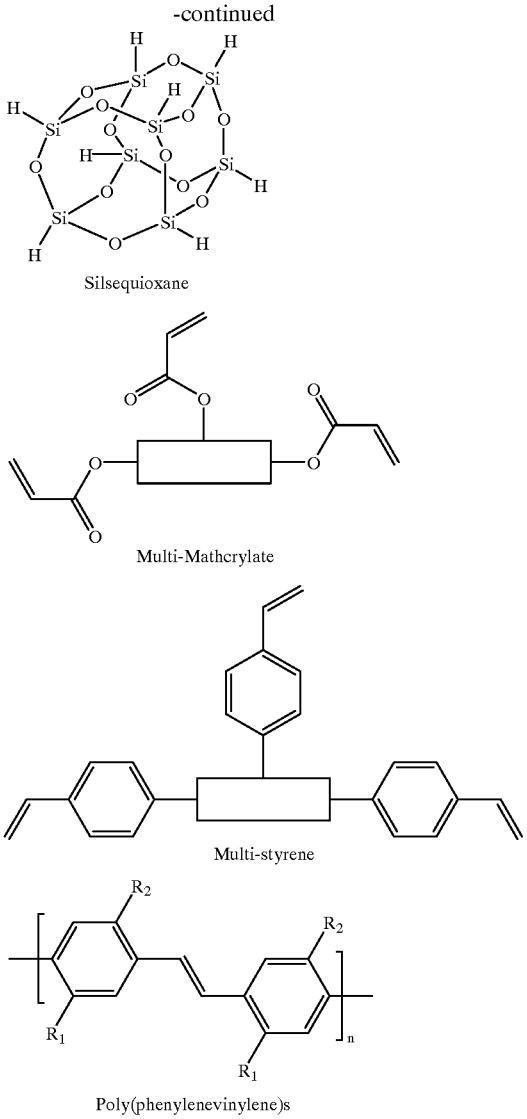

Scheme 5: Typical Examples of Cross-linkable Polymers or Compounds

The luminescent chromophores, the charge transporter, and other functional groups, like cross-linking functional groups, may be alternatively bound to a molecular moiety of a polymer chain.

To adjust the L-ink surface tension, and to modify the electrical property of the printed luminescent film, the functional additive included in the L-ink can comprise a surfactant with an ionic terminal and alkyl terminal. The surfactant can also comprise a neutral surfactant, such as Brij surfactant, or poly(ethyl oxide), or copolymer of ethyl oxide and propyl oxide, having a general formula:

$(CH_2CH_2O)_n(CH_2CHCH_3O)_m$ (neutral)

Where n and m range from 0 to 100 and n+m ranges from 6 to 200.

Typical cationic type surfactants have a general formula:

$MXR_3R'$ (cationic)

Where M is $Na^+$, $K^+$, $Li^+$, $Mg^{+2}$, or $H^+$; X is $Cl^-$, $Br^-$, $I^-$, $SO_4^{-2}$; R is alkyl with carbon number below 6, and R' is a long alkyl $C_n$ where n is 6–40. Examples of typical cationic surfactants include, but are not limited to, tetrabutyl ammonium chloride and tributyl decyl ammonium bromide.

The surfactant is preferably an ether sulfate or ether phosphate, having the following general formula:

$MYO_3R$ (anionic)

Where M is $Na^+$, $K^+$, $Li^+$, $Mg^+$, or $H^+$; R is $C_nH_{2n+1}$ or $OC_nH_{2n+1}$ with n ranging from 4 to 40; and Y is S or P. The use of such highly polarizable additives to improve polymer LEDs has been describe by Cao (U.S. Pat. No. 5,965,281).

To obtain highly efficient LEDs, electronic dopants may be added to the L-ink. The term of dopants is based on conventional silicon semiconductor terminology, wherein a small quantity of dopant can dramatically influence its electrical property. For a L-ink, a small dose of rubrene (red luminescent compound) (less than 5% for instance) addition into $Alq_3$ (green luminescent compound, more than 94%) can change the material from green light emitter to a red light emitter. This color emission change is caused by the increased energy injected (by electrons and holes) into the $Alq_3$ (green, hence more energy than red), which is subsequently (energetically) transferred into a lower energy site (here i.e. rubrene, red luminescent material and less energy). Alternatively, some heavy metal porphyrin can be included in the L-ink, like red phosphor 2,3,7,8,12,13,17,18-octaethyl-21H, 23H-porphorine platinum (PtOEP), or green phosphor tris(2-phenylpyridine) iridium $[Ir(ppy)_3]$ into the L-ink. The addition of such phosphors can promote the transition of triplet excited state to singlet excited state, and thereby increase light-emission efficiency [D. F. O'Brien, et al., *Appl. Phys. Lett.*, 74, 442 (1999)]. The dopant amount is preferably between 0.01 to 15%, preferably between 0.1–8%, and most preferably between 0.5 to 5% by weight.

Thin films printed with L-ink may be used for various applications, particularly optical, electronic, and electrochemical applications. Being highly luminescent, the printed films can be used as photoluminescent emitting devices under short wavelength light irradiation, for instance UV irradiation. Because the printed thin films consist of semiconducting organic chromophores, they can possess electrochemical activity, like electrochromic phenomena for smart window and for display applications. As a semiconductive thin film, photovoltaic applications are also possible. Preferably, such films are used as active layers in organic light-emitting diodes (OLEDs). An OLED typically consist of a luminescent thin film sandwiched between an anode made of high work function metal like gold, silver, copper, or preferably transparent indium-tin oxide (ITO) and a cathode made of low work function metal, like calcium, magnesium, lithium, sodium, or aluminum.

Under a suitable potential bias, holes are injected into the luminescent thin film through anode and electrons through cathode. The recombination of a hole and an electron may lead to the formation of an exciton which will undergo annihilation to emit light corresponding the band gap energy of the luminescent thin film. By using printing technology, a L-ink can be used to form a thin film on an anode surface, for example, on ITO-coated glass or polymer substrate. The printed thin film can be featured with various patterns, controlled digitally. Cathode metal can be deposited on top of the L-ink printed thin film to form a simple LED.

In many cases, a double or a multi-layer LED may be fabricated, in which one or two different charge-transporting layers are used. Each individual layer may be a polymeric or organic film with a thickness less than 1500 nm, preferably less than 300 nm. One example of a multi-layer LED 10 is illustrated in FIG. 1.

The anode substrate 12, preferably ITO on a clear substrate 13, may be pre-coated with a layer of a hole-transporting material 14 either by spin-coating, or by printing. A typical hole transporting layer 14 can be selected from, but not limited to, polyaniline, poly(phenylenevinylene), poly(3,4-ethylenedioxy-thiophene) (PEDOT) (doped with polystyrenesulfonic acid), poly(N-vinyl carbazole) (PVK), or an aromatic amine organic compound or polymer. In this case, the L-ink solvent is selected to be compatible with the anode such that it does not corrode or dissolve the ITO layer. The thickness of the hole-transporting layer 14 is preferably between 0.5 nm to 500 nm, and more preferably less than 150 nm.

Figure 2:
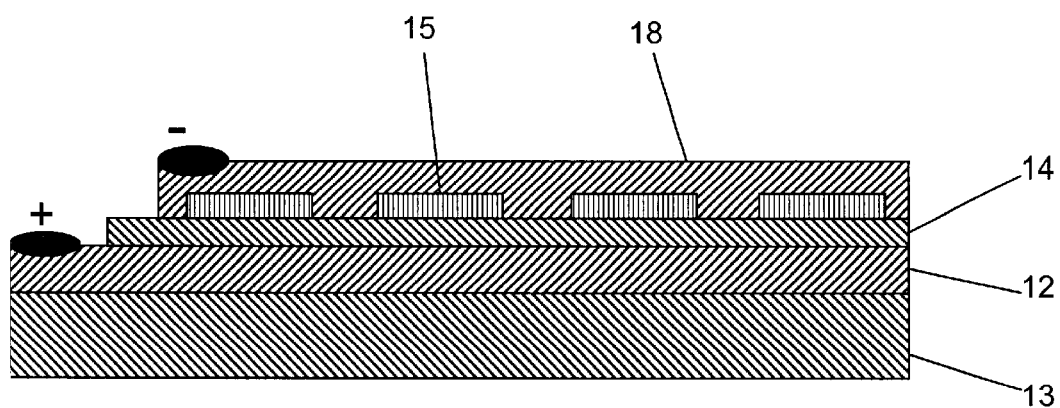
FIG. 2 is a schematic cross-sectional representation of another possible solid state electronic device containing printed luminescent thin films.

As shown in FIG. 2, a luminescent layer 15 can be directly printed on the anode substrate 12, or printed on top of the hole-transporting layer 14. For the latter processing, the L-ink solvent is selected to be compatible with the hole-transporting layer 12 such that it does not dissolve the hole-transporting layer. Depending on the formulated L-ink, the luminescent layer 15 can emit various colors from red, yellow, green, to blue. The thickness of the luminescent layer 15 is preferably between 10 nm to 300 nm, preferably between 50 nm to 200 nm.

The ITO substrate printed with a L-ink hole-transporting layer 14 may be further coated with a layer of an electron-transporting material 16 either by spin-coating or by printing. A typical electron-transporting layer 16 can be selected from, but are not limited to, poly(aromatic oxadiazole) [X.-C. Li, et al, *J. Chem. Soc. Chem. Commun.*, 1995, 2211], organic compounds containing aromatic oxadiazoles, triazoles, quinolines, such as 2-tert-butyl-phenyl-5-biphenyl-1,3,4-oxadiazole (PBD), and Alq3. Evaporation or solution coating may be employed. For solution coating (spin-coating or printing), it is again important to select a suitable solvent for the electron transporting solution or ink that does not corrode or dissolve the luminescent layers, anode or cathode. Preferably, an L-ink with cross-linking ability is used. In a preferred embodiment, the cross-linking process can be accomplished by UV irradiation or moderate thermal treatment (less than 300° C.) of the inked ITO substrate after printing.

The cathode layer 18 can be deposited either by thermal vacuum evaporation, or by sputtering. The presently preferred cathode metals are aluminum, calcium and magnesium. The thickness of the cathode layer 18 is preferably between 0.5 nm to 5000 nm, preferably thicker than 50 nm.

EXAMPLES

The following examples are given to illustrate various embodiments within the scope of the present invention. These are given by way of example only, and it is to be understood that the following examples are not comprehensive or exhaustive of the many types of embodiments of the present invention that can be prepared in accordance with the present invention.

Example 1

A L-ink is prepared by combining the following ingredients in a solvent:

| | |
|---|---|
| MEH-PPV: | 1.2 parts by weight |
| Toluene: | 100 parts |
| Rhodamine B: | 0.5 parts |
| PBD: | 0.2 parts |
| N-methyl-2-pyrrolidone: | 12 parts |

The ink composition gives red fluorescence and is characterized by a peak of 620 nm. The L-ink has a viscosity between 8 and 20 cp. The L-ink prints a thin film having a thickness between about 50 nm to 150 nm. The dry/cure time is about three hours under vacuum at 40° C. The thin film is semi-conductive, with a conductivity below $10^{-6}$ S/cm.

Example 2

A L-ink is prepared by combining the following ingredients in a solvent:

| | |
|---|---|
| Tris(8-hydroxyquinoline) Aluminum (Alq$_3$): | 2.0 parts by weight |
| Poly(2-tributylsilyl-1,4-phenylenevinylene): | 0.5 parts |
| 1,2-Dichlorobenzene: | 100 parts |
| Poly(N-vinyl carbazole): | 0.5 parts |

The ink composition gives green fluorescence. The L-ink has a viscosity between 8 and 20 cp. The L-ink prints a thin film having a thickness between about 50 nm to 150 nm. The dry/cure time is about three hours under vacuum at 40° C. The thin film is semi-conductive, with a conductivity below $10^{-6}$ S/cm.

Example 3

A L-ink is prepared by combining the following ingredients in a solvent:

| | |
|---|---|
| Poly(9,9-dioctyl-fluorene): | 1.5 parts by weight |
| Xylene: | 100 parts |
| 1,1,4,4-tetraphenyl-1,3-butadiene: | 1.0 parts |
| PBD: | 0.8 parts |
| TPD: | 0.5 parts |
| Lithium octylphenoxy Ether sulfate: | 0.15 parts |

The ink composition gives blue fluorescence. The L-ink has a viscosity between 8 and 20 cp. The L-ink prints a thin film having a thickness between about 50 nm to 150 nm. The dry/cure time is about three hours under vacuum at 40° C. The thin film is semi-conductive, with a conductivity below $10^{-6}$ S/cm.

Example 4

A L-ink is prepared by combining the following ingredients in a solvent:

| | |
|---|---|
| Poly(2-lithium carboxylic acid-1,4-phenylenevinylene): | 1.5 parts by weight |
| Water: | 100 parts |
| Pyridine: | 2.0 parts |
| Poly(ethyl glycol): | 2.0 parts |

The ink composition gives green luminescence. The L-ink has a viscosity between 8 and 20 cp. The L-ink prints a thin film having a thickness between about 50 nm to 150 nm. The dry/cure time is about three hours under vacuum at 40° C. The thin film is semi-conductive, with a conductivity below $10^{-6}$ S/cm.

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

What is claimed is:

1. A luminescent ink for printing of organic luminescent devices comprising:
a luminescent organic compound;
an inert solvent;
a functional additive in an amount sufficient to modify the viscosity of the luminescent ink to a viscosity in the range from about 3 to 90,000 cp, and in an amount to modulate optical and charge transporting properties; and
a cross-linking agent.

2. A luminescent ink for printing according to claim 1, wherein the functional additive comprises an organic luminescent molecule having a molecular weight less than 5000 g/mol.

3. A luminescent ink for printing according to claim 2, wherein the organic luminescent molecule is selected from anthracene, tris(8-hydroxy quinoline) aluminum, 4,4'-N,N'-dicarbazole-biphenyl, distyrylbenzene, 3-(2-benzothiazolyl)-7-(diethylamino)-coumarin, and rubrene.

4. A luminescent ink for printing according to claim 2, wherein the organic luminescent molecule concentration range is between 0.5 to 40 percent of the solid ingredients.

5. A luminescent ink for printing according to claim 1, wherein the functional additive comprises an organic luminescent polymer having a molecular weight larger than 5000 g/mol.

6. A luminescent ink for printing according to claim 5, wherein the organic luminescent polymer is selected from poly(vinyl carbazole), poly(9,9'-dialkylfluorene), poly(phenylene) derivatives, poly(2-silyl-phenylenevinylene), poly(2,5-dialkoxy-phenylenevinylene), and poly(aromatic oxadiazole).

7. A luminescent ink for printing according to claim 5, wherein the organic luminescent polymer concentration range is between 0.5 to 40 percent of the solid ingredients.

8. A luminescent ink for printing according to claim 1, wherein the functional additive comprises a charge transporting functional additive selected from a hole-transporting material and an electron-transporting material.

9. A luminescent ink for printing according to claim 8, wherein the electron-transporting material is selected from organic compounds containing aromatic oxadiazoles, triazoles, quinolines, or combinations thereof.

10. A luminescent ink for printing according to claim 8, wherein the hole-transporting material possess electron donating properties.

11. A luminescent ink for printing according to claim 8, wherein the hole-transporting material is selected from organic compounds containing aromatic amines, carbazoles, thiophenes, copper phthalocyanine, poly(N-vinyl-carbazole), and polythiophene derivatives.

12. A luminescent ink for printing according to claim 1, wherein the functional additive comprises a surfactant with an ionic terminal and alkyl terminal, having the following general formula:

$$MYO_3R$$

wherein M is $Na^+$, $K^+$, $Li^+$, $Mg^{+2}$, or $H^+$; R is $C_nH_{2n+1}$, or $OC_nH_{2n+1}$ with n ranging from 4 to 40; and Y is S or P.

13. A luminescent ink for printing according to claim 1, wherein the functional additive comprises a surfactant having the following general formula:

$$(CH_2CH_2O)_n(CH_2CHCH_3O)_m$$

wherein n and m range from 0 to 100 and n+m ranges from 6 to 200.

14. A luminescent ink for printing according to claim 1, wherein the functional additive comprises a surfactant with an ionic terminal and alkyl terminal, having the following general formula:

$$MXR_3R'$$

wherein M is $Na^+$, $K^+$, $Li^+$, $Mg^{+2}$, or $H^+$; X is $Cl^-$, $Br^-$, $I^-$, $SO_4^{-2}$; R is alkyl with carbon number below 6, and R' is a long alkyl $C_n$ where n is 6–40.

15. A luminescent ink for printing according to claim 1, wherein the functional additive is present in an amount sufficient to modify the viscosity of the luminescent ink to a viscosity in the range from about 5 to 100 cp.

16. A luminescent ink for printing according to claim 1, wherein the cross-linking agent has a concentration in the range from about 0.5 to 30 wt. % of the solid ingredients.

17. A luminescent ink for printing according to claim 1, wherein the cross-linking agent has a concentration in the range from about 1 to 10 wt. % of the solid ingredients.

18. A luminescent ink for printing according to claim 1, wherein the cross-linking agent is selected from organic compounds containing a reactive functional group that undergoes chemical reaction to form insoluble network under irradiation or thermal condition.

19. A luminescent ink for printing according to claim 18, wherein the reactive functional group is selected from acrylate, methacrylate, cynamoyl, styrene, vinyl, azide, epoxide, and hydrosilane.

20. A luminescent ink for printing according to claim 1, wherein the solvent has a boiling point in the range from about 40° C. to about 200° C.

21. A luminescent ink for printing according to claim 1, wherein the solvent is selected from water, methanol, ethanol, isopropanol, butanol, dioxane, toluene, chloroform, tetrahydrofuran, dichlorobenzene, 1,2-dichloroethane, and xylenes.

22. A luminescent ink for printing according to claim 1, wherein the luminescent ink contains from about 50% to about 99.8% solvent, by weight.

23. A luminescent ink for printing according to claim 1, wherein the luminescent organic compound comprises a luminescent chromophore bound to a binding polymer.

24. A luminescent ink for printing according to claim 1, wherein the luminescent organic compound comprises a conjugated luminescent polymer.

25. A luminescent ink for printing according to claim 1, wherein the luminescent organic compound comprises a luminescent poly(phenylene vinylene) polymer, or its derivative.

26. A luminescent ink for printing according to claim 1, wherein the luminescent organic compound comprises a luminescent polythiophene polymer.

27. A luminescent ink for printing according to claim 1, wherein the luminescent organic compound comprises a luminescent polyfluorene polymer.

28. A method of fabricating an organic luminescent device comprising the steps of:

obtaining a first electrode surface;

printing a luminescent ink onto the first electrode surface to form a first thin film of luminescent material, wherein the luminescent ink comprises:
a luminescent organic compound;
an inert solvent;
a functional additive in an amount sufficient to modify the viscosity of the luminescent ink to a viscosity in the range from about 5 to 1,000 cp, and/or modify the charge transporting ability of the luminescent ink to a balanced mode; and
a cross-linking agent;

initiating a cross-linking reaction in the luminescent ink; and coupling a second electrode to the printed film of luminescent material.

29. A method of fabricating an organic luminescent device according to claim 28, wherein the luminescent ink is printed by ink-jet printing, bubble-jet printing, stamp printing, or screen printing.

30. A method of fabricating an organic luminescent device according to claim 28, further comprising the step of printing a luminescent ink onto the first thin film of luminescent material to form a second thin film of luminescent material.

31. A method of fabricating an organic luminescent device according to claims 30, wherein the first thin film and second thin film are printed with different luminescent inks.

32. An LED fabricated by the method of claim 28.

33. A thin film transistor fabricated by the method of claim 28.

34. A photovoltaic solar cell fabricated by the method comprising the steps of:

obtaining a first electrode surface;

printing a luminescent ink onto the first electrode surface to form a first thin film of luminescent material, wherein the luminescent ink comprises:
a luminescent organic compound;
an inert solvent; and
a functional additive in an amount sufficient to modify the viscosity of the luminescent ink to a viscosity in the range from about 5 to 1,000 cp, and/or modify the charge transporting ability of the luminescent ink to a balanced mode; and coupling a second electrode to the printed film of luminescent material.

35. An electrochromic display device fabricated by the method of claim 28.

36. An electroluminescent device for flat-panel display fabricated by the method of claim 28.

37. A luminescent ink for printing of organic luminescent devices comprising:
a luminescent organic compound selected from luminescent chromophores bound to a binding polymer and conjugated luminescent polymers;
an inert solvent, wherein the solvent has a boiling point in the range from about 40° C. to about 200° C., and wherein the luminescent ink contains from about 50% to about 99.8% solvent, by weight;
a functional additive having charge transporting, luminescent, or surfactant properties, said functional additive having a concentration in the luminescent ink in the range from 0.5 to 40 percent of the solid ingredients sufficient to modify the viscosity of the luminescent ink to a viscosity in the range from about 3 to 90,000 cp, and in an amount to modulate optical and charge transporting properties; and
a cross-linking agent.

38. A luminescent ink for printing according to claim 37, wherein the functional additive comprises an organic luminescent molecule having a molecular weight less than 5000 g/mol.

39. A luminescent ink for printing according to claim 38, wherein the organic luminescent molecule is selected from anthracene, tris(8-hydroxy quinoline) aluminum, 4,4'-N,N'-dicarbazole-biphenyl, distyrylbenzene, 3-(2-benzothiazolyl)-7-(diethylamino)-coumarin, and rubrene.

40. A luminescent ink for printing according to claim 37, wherein the functional additive comprises an organic luminescent polymer having a molecular weight larger than 5000 g/mol.

41. A luminescent ink for printing according to claim 40, wherein the organic luminescent polymer is selected from poly(vinyl carbazole), poly(9,9'-dialkylfluorene), poly(phenylene) derivatives, poly(2-silyl-phenylenevinylene), poly(2,5-dialkoxy-phenylenevinylene), and poly(aromatic oxadiazole).

42. A luminescent ink for printing according to claim 37, wherein the functional additive comprises an electron-transporting molecule selected from organic compounds containing aromatic oxadiazoles, triazoles, quinolines, or combinations thereof.

43. A luminescent ink for printing according to claim 37, wherein the functional additive comprises a hole-transporting molecule selected from organic compounds containing aromatic amines, carbazoles, thiophenes, copper phthalocyanine, poly(N-vinyl-carbazole), and poly-thiophene derivatives.

44. A luminescent ink for printing according to claim 37, wherein the functional additive comprises a surfactant with an ionic terminal and alkyl terminal, having the following general formula:

MYO$_3$R wherein M is Na$^+$, K$^+$, Li$^+$, Mg$^{+2}$, or H$^+$; R is C$_n$H$_{2n+1}$, or OC$_n$H$_{2n+1}$ with n ranging from 4 to 40; and Y is S or P.

45. A luminescent ink for printing according to claim 37, wherein the functional additive comprises a surfactant having the following general formula:

(CH$_2$CH$_2$O)$_n$(CH$_2$CHCH$_3$O)$_m$ wherein n and m range from 0 to 100 and n+m ranges from 6 to 200.

46. A luminescent ink for printing according to claim 37, wherein the functional additive comprises a surfactant with an ionic terminal and alkyl terminal, having the following general formula:

MXR$_3$R' wherein M is Na$^+$, K$^+$, Li$^+$, Mg$^{+2}$, or H$^+$; X is Cl$^-$, Br$^-$, I$^-$, SO$_4^{-2}$; R is alkyl with carbon number below 6, and R' is a long alkyl C$_n$ where n is 6–40.

47. A luminescent ink for printing according to claim 37, wherein the functional additive is present in an amount sufficient to modify the viscosity of the luminescent ink to a viscosity in the range from about 5 to 100 cp.

48. A luminescent ink for printing according to claim 37, wherein the cross-linking agent has a concentration in the range from about 0.5 to 30 wt. % of the solid ingredients.

49. A luminescent ink for printing according to claim 37, wherein the cross-linking agent has a concentration in the range from about 1 to 10 wt. % of the solid ingredients.

50. A luminescent ink for printing according to claim 37, wherein the cross-linking agent is selected from organic compounds containing a reactive functional group that undergoes chemical reaction to form insoluble network under irradiation or thermal condition.

51. A luminescent ink for printing according to claim 50, wherein the reactive functional group is selected from acrylate, methacrylate, cynamoyl, styrene, vinyl, azide, epoxide, and hydrosilane.

52. A luminescent ink for printing according to claim 37, wherein the solvent is selected from water, methanol, ethanol, isopropanol, butanol, dioxane, toluene, chloroform, tetrahydrofuran, dichlorobenzene, 1,2-dichloroethane, and xylenes.

53. A luminescent ink for printing according to claim 37, wherein the luminescent organic compound comprises a luminescent poly(phenylene vinylene) polymer, or its derivative.

54. A luminescent ink for printing according to claim 37, wherein the luminescent organic compound comprises a luminescent polythiophene polymer.

55. A luminescent ink for printing according to claim 37, wherein the luminescent organic compound comprises a luminescent polyfluorene polymer.

56. A luminescent ink for printing of organic luminescent devices comprising:
   a luminescent organic compound;
   an inert solvent; and
   a functional additive in an amount sufficient to modify the viscosity of the luminescent ink to a viscosity in the range from about 3 to 90,000 cp, and in an amount to modulate optical and charge transporting properties, wherein the functional additive comprises an organic luminescent molecule having a molecular weight less than 5000 g/mol and a concentration range between 0.5 to 40 percent of the solid ingredients.

57. A luminescent ink for printing according to claim 56 wherein the organic luminescent molecule is selected from anthracene, tris(8-hydroxy quinoline) aluminum, 4,4'-N,N'-dicarbazole-biphenyl, distyrylbenzene, 3-(2-benzothiazolyl)-7-(diethylamino)-coumarin, and rubrene.

58. A luminescent ink for printing according to claim 56, wherein the functional additive further comprises a charge transporting functional additive selected from a hole-transporting material and an electron-transporting material.

59. A luminescent ink for printing according to claim 58, wherein the electron-transporting material is selected from organic compounds containing aromatic oxadiazoles, triazoles, quinolines, or combinations thereof.

60. A luminescent ink for printing according to claim 58, wherein the hole-transporting material is selected from organic compounds containing aromatic amines, carbazoles, thiophenes, copper phthalocyanine, poly(N-vinyl-carbazole), and polythiophene derivatives.

61. A luminescent ink for printing according to claim 56, wherein the functional additive further comprises a surfactant with an ionic terminal and alkyl terminal, having the following general formula:

MYO$_3$R wherein M is Na$^+$, K$^+$, Li$^+$, Mg$^{+2}$, or H$^+$; R is C$_n$H$_{2n+1}$, or OC$_n$H$_{2n+1}$ with n ranging from 4 to 40 and Y is S or P.

62. A luminescent ink for printing according to claim 56, wherein the functional additive further comprises a surfactant having the following general formula:

(CH$_2$CH$_2$O)$_n$(CH$_2$CHCH$_3$O)$_m$ wherein n and m range from 0 to 100 and n+m ranges from 6 to 200.

63. A luminescent ink for printing according to claim 56, wherein the functional additive comprises a surfactant with an ionic terminal and alkyl terminal, having the following general formula:

MXR$_3$R' wherein M is Na$^+$, K$^+$, Li$^+$, Mg$^{+2}$, or H$^+$; X is Cl$^-$, Br$^-$I$^-$, SO$_4^{-2}$; R is alkyl with carbon number below 6, and R' is a long alkyl C$_n$ where n is 6–40.

64. A luminescent ink for printing according to claim 56, wherein the functional additive is present in an amount sufficient to modify the viscosity of the luminescent ink to a viscosity in the range from about 5 to 100 cp.

65. A luminescent ink for printing according to claim 56, further comprising a cross-linking agent.

66. A luminescent ink for printing according to claim 65, wherein the cross-linking agent has a concentration in the range from about 0.5 to 30 wt. % of the solid ingredients.

67. A luminescent ink for printing according to claim 65, wherein the cross-linking agent has a concentration in the range from about 1 to 10 wt. % of the solid ingredients.

68. A luminescent ink for printing according to claim 56, wherein the solvent has a boiling point in the range from about 40° C. to about 200° C.

69. A luminescent ink for printing according to claim 56, wherein the-solvent is selected from water, methanol, ethanol, isopropanol, butanol, dioxane, toluene, chloroform, tetrahydrofuran, dichlorobenzene, 1,2-dichloroethane, and xylenes.

70. A luminescent ink for printing according to claim 56, wherein the luminescent ink contains from about 50% to about 99.8% solvent, by weight.

71. A luminescent ink for printing according to claim 56, wherein the luminescent organic compound comprises a luminescent chromophore bound to a binding polymer.

72. A luminescent ink for printing according to claim 56, wherein the luminescent organic compound comprises a conjugated luminescent polymer.

73. A luminescent ink for printing according to claim 56, wherein the luminescent organic compound comprises a luminescent poly(phenylene vinylene) polymer, or its derivative.

74. A luminescent ink for printing according to claim 56, wherein the luminescent organic compound comprises a luminescent polythiophene polymer.

75. A luminescent ink for printing according to claim 56, wherein the luminescent organic compound comprises a luminescent polyfluorene polymer.

76. A luminescent ink for printing of organic luminescent devices comprising:
   a luminescent organic compound;
   an inert solvent; and
   a functional additive in an amount sufficient to modify the viscosity of the luminescent ink to a viscosity in the range from about 3 to 90,000 cp, and in an amount to modulate optical and charge transporting properties, wherein the functional additive comprises an electron-transporting material.

77. A luminescent ink for printing according to claim 76, wherein the functional additive further comprises a surfactant with an ionic terminal and alkyl terminal, having the following general formula:

MYO$_3$R wherein M is Na$^+$, K$^+$, Li$^+$, Mg$^{+2}$, or H$^+$; R is C$_n$H$_{2n+1}$, or OC$_n$H$_{2n+1}$ with n ranging from 4 to 40; and Y is S or P.

78. A luminescent ink for printing according to claim 76, wherein the functional additive further comprises a surfactant having the following general formula:

$$(CH_2CH_2O)_n(CH_2CHCH_3O)_m$$

wherein n and m range from 0 to 100 and n+m ranges from 6 to 200.

79. A luminescent ink for printing according to claim 76, wherein the functional additive comprises a surfactant with an ionic terminal and alkyl terminal, having the following general formula:

$$MXR_3R'$$

wherein M is $Na^+$, $K^+$, $Li^+$, $Mg^{+2}$, or $H^+$; X is $Cl^-$, $Br^-$, $I^-$, $SO_4^{-2}$; R is alkyl with carbon number below 6, and R' is a long alkyl $C_n$ where n is 6–40.

80. A luminescent ink for printing according to claim 76, wherein the functional additive is present in an amount sufficient to modify the viscosity of the luminescent ink to a viscosity in the range from about 5 to 100 cp.

81. A luminescent ink for printing according to claim 76, further comprising a cross-linking agent.

82. A luminescent ink for printing according to claim 81, wherein the cross-linking agent has a concentration in the range from about 0.5 to 30 wt. % of the solid ingredients.

83. A luminescent ink for printing according to claim 81, wherein the cross-linking agent has a concentration in the range from about 1 to 10 wt. % of the solid ingredients.

84. A luminescent ink for printing according to claim 76, wherein the solvent has a boiling point in the range from about 40° C. to about 200° C.

85. A luminescent ink for printing according to claim 76, wherein the solvent is selected from water, methanol, ethanol, isopropanol, butanol, dioxane, toluene, chloroform, tetrahydrofuran, dichlorobenzene, 1,2-dichloroethane, and xylenes.

86. A luminescent ink for printing according to claim 76, wherein the luminescent ink contains from about 50% to about 99.8% solvent, by weight.

87. A luminescent ink for printing according to claim 76, wherein the luminescent organic compound comprises a luminescent chromophore bound to a binding polymer.

88. A luminescent ink for printing according to claim 76, wherein the luminescent organic compound comprises a conjugated luminescent polymer.

89. A luminescent ink for printing according to claim 76, wherein the luminescent organic compound comprises a luminescent poly(phenylene vinylene) polymer, or its derivative.

90. A luminescent ink for printing according to claim 76, wherein the luminescent organic compound comprises a luminescent polythiophene polymer.

91. A luminescent ink for printing according to claim 76, wherein the luminescent organic compound comprises a luminescent polyfluorene polymer.

92. A luminescent ink for printing according to claim 76, wherein the electron-transporting material is selected from organic compounds containing aromatic oxadiazoles, triazoles, quinolines, or combinations thereof.

93. A luminescent ink for printing of organic luminescent devices comprising:
   a luminescent organic compound;
   an inert solvent; and
   a functional additive in an amount sufficient to modify the viscosity of the luminescent ink to a viscosity in the range from about 3 to 90,000 cp, and in an amount to modulate optical and charge transporting properties, wherein the functional additive comprises a dopant that promotes excited energy state transfer.

94. A luminescent ink for printing according to claim 93, wherein the dopant promotes the transition of triplet excited state to singlet excited state.

95. A luminescent ink for printing according to claim 93, wherein the luminescent ink contains the dopant in an amount from 0.01 to 15%, by weight.

96. A luminescent ink for printing according to claim 93, wherein the luminescent ink contains the dopant in an amount from 0.1 to 8%, by weight.

97. A luminescent ink for printing according to claim 93, wherein the luminescent ink contains the dopant in an amount from 0.5 to 5%, by weight.

98. A luminescent ink for printing according to claim 93, wherein the dopant is a heavy metal porphyrin.

99. A luminescent ink for printing according to claim 95, wherein the dopant is selected from red phosphor 2,3,7,8,12,13,17,18-octaethyl-21H, 23H-porphorine platinum and green phosphor tris(2-phenylpyridine) iridium.

* * * * *

UNITED STATES PATENT AND TRADEMARK OFFICE
CERTIFICATE OF CORRECTION

PATENT NO. : 6,372,154 B1
DATED : April 16, 2002
INVENTOR(S) : Xiao-Chang Charles Li It is certified that error appears in the above-identified patent and that said Letters Patent is hereby corrected as shown below:

Title page,
Item [56], References Cited, U.S. PATENT DOCUMENTS, insert
-- 5,247,190 A * 9/1993 Friend et al. ............................... 257/40
5,495,502 A * 8/1999 Hsieh et al. ............................... 528/101
5,558,904 A * 9/1996 Hsieh et al. ............................... 427/66
5,777,070 A * 7/1998 Inbasekaran et al. ..................... 528/394
5,817,430 A * 10/1998 Hsieh .......................................... 428/690
5,858,563 A * 1/1999 Sano et al. ................................. 428/690
5,882,761 A * 3/1999 Kawami et al. ........................... 428/69
5,935,720 A * 8/1999 Chen et al. ................................. 428/690 --;
OTHER PUBLICATIONS,
Insert -- Bao, Zhenan et al., unknown title, J. Mater. Chem., 1999, pp. 1895-1904. --;
Chang et al., "al, "Mukticolor" should read -- al., "Multicolor --;
Insert -- Li, Xiao Chang, et al., "Synthesis and Properties of Novel High-Electron-Affinity Polymers for Electroluminescent Devices", ACS Symposium Series, 1997, pp. 322-344.
Peng, Zhonghua, et al., "Polymers with Bipolar Carrier Transport Abilities for Light Emitting Diodes", Chem. Mater. 1998, 10, pp. 2086-2090. --;
Tang, C.W., "Sep. 21" should read -- Sep. 21, 1987, --.

Column 2,
Line 65, "thiphenes," should read -- thiophenes, --.

Column 4,
Line 41, "nathptha-phenyl" should read -- naphtha-phenyl --; and
Line 50, "inkisubstrate-contacting" should read -- ink/substrate-contacting --.

UNITED STATES PATENT AND TRADEMARK OFFICE
CERTIFICATE OF CORRECTION

PATENT NO. : 6,372,154 B1
DATED : April 16, 2002
INVENTOR(S) : Xiao-Chang Charles Li It is certified that error appears in the above-identified patent and that said Letters Patent is hereby corrected as shown below:

Column 8,
Line 14, "Color" should read -- Colors --;
Line 48, "(PIS)," should read -- (PS), --; and
Line 53, "used." should read
        -- used.

X: H, CH₃, Ph, Cl, OH, CN

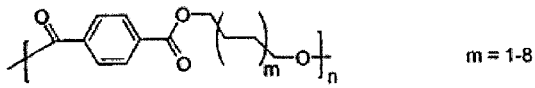
m = 1-8

Scheme 3: Typical structures of commercial binding polymers --.

Column 10,
Line 14, "Example" should read -- Examples --.

Column 11,
Line 21, "Multi-Mathcrylate" should read -- Multi-Methacrylate --.

Column 12,
Line 10, "describe" should read -- described --;
Line 46, "consist" should read -- consists --; and
Line 55, "corresponding" should read -- corresponding to --.

Column 15,
Line 55, "possess" should read -- possesses --.

Column 17,
Line 27, "claims 30," should read -- claim 30, --.

Column 19,
Line 35, "claim 56" should read -- claim 56, --; and
Line 60, "40" should read -- 40; --.

UNITED STATES PATENT AND TRADEMARK OFFICE
CERTIFICATE OF CORRECTION

PATENT NO. : 6,372,154 B1
DATED : April 16, 2002
INVENTOR(S) : Xiao-Chang Charles Li It is certified that error appears in the above-identified patent and that said Letters Patent is hereby corrected as shown below:

Column 20,
Line 7, "Br ⁻I⁻," should read -- Br⁻, I⁻, --; and
Line 26, "the-solvent" should read -- the solvent --.

Signed and Sealed this

First Day of July, 2003

JAMES E. ROGAN
*Director of the United States Patent and Trademark Office*